(12) United States Patent
Zhang et al.

(10) Patent No.: US 7,344,965 B2
(45) Date of Patent: Mar. 18, 2008

(54) METHOD OF ETCHING DUAL PRE-DOPED POLYSILICON GATE STACKS USING CARBON-CONTAINING GASEOUS ADDITIONS

(75) Inventors: Ying Zhang, Yorktown Heights, NY (US); Timothy Joseph Dalton, Ridgefield, CT (US); Wesley Natzle, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 668 days.

(21) Appl. No.: 10/730,891

(22) Filed: Dec. 10, 2003

(65) Prior Publication Data
US 2006/0183308 A1    Aug. 17, 2006

(51) Int. Cl.
*H01L 21/3205* (2006.01)
*H01L 21/4763* (2006.01)

(52) U.S. Cl. .................. 438/585; 438/584; 438/714; 438/689; 438/738; 257/E29.123; 257/E29.126

(58) Field of Classification Search ............... 438/585, 438/714; 257/301
See application file for complete search history.

(56) References Cited

U.S. PATENT DOCUMENTS

| | | | | |
|---|---|---|---|---|
| 5,242,538 A | * | 9/1993 | Hamrah et al. | 216/66 |
| 5,318,666 A | * | 6/1994 | Elkind et al. | 438/718 |
| 5,814,563 A | * | 9/1998 | Ding et al. | 438/714 |
| 5,876,879 A | | 3/1999 | Kleinhenz et al. | |
| 6,162,733 A | * | 12/2000 | Obeng | 438/706 |
| 6,849,557 B1 | * | 2/2005 | Ko | 438/738 |
| 6,867,450 B2 | * | 3/2005 | Kito et al. | 257/301 |
| 6,887,747 B2 | * | 5/2005 | Yagishita et al. | 438/197 |
| 6,982,223 B2 | * | 1/2006 | Kim et al. | 438/632 |
| 2001/0053609 A1 | * | 12/2001 | Ko | 438/706 |

(Continued)

OTHER PUBLICATIONS

J. Pelletier and M.J. Cooke☐☐Microwave plasma etching of Si and SiO2 in halogen mixtures: Interpretation of etching mechanisms. ☐☐Jan./Feb. 1989☐☐Journal of Vacuum Science and Technology B☐☐American society of Vacuum Society☐☐☐☐☐.*

(Continued)

*Primary Examiner*—Michael Lebentritt
*Assistant Examiner*—Abdulfattah Mustapha
(74) *Attorney, Agent, or Firm*—Connolly Bove Lodge & Hutz LLP; Robert M. Trepp

(57) ABSTRACT

A method for making dual pre-doped gate stacks used in semiconductor applications such as complementary metal oxide semiconductor (CMOS) devices and metal oxide semiconductor field effect transistors (MOSFETs) is provided. The method involves providing at least one pre-doped conductive layer, such as poly silicon (poly-Si), on a gate stack and etching by exposing the conductive layer to an etching composition comprising at least one carbon containing gas. The carbon containing gas can be selected from gases having the general formula $C_xH_y$, such as, for example, $CH_4$, $C_2H_2$, $C_2H_4$, and $C_2H_6$. The carbon containing gas can further be selected from gases having the general formula $C_xH_yA$, wherein A can represent one or more additional substituents selected from O, N, P, S, F, Cl, Br, and I. The processes can result in dual pre-doped gate stacks having essentially vertical sidewalls and further having a width of at least about 3 nm, such as from about 5 nm to about 150 nm.

16 Claims, 8 Drawing Sheets

U.S. PATENT DOCUMENTS

2004/0038516 A1* 2/2004 Kim et al. .................. 438/624
2005/0035409 A1* 2/2005 Ko et al. .................... 257/350
2005/0079655 A1* 4/2005 Chen et al. ................. 438/140

OTHER PUBLICATIONS

O. Joubert, J. Pelletier, C. Fiori and T. A. Nguyen Tan□□Surface mechanisms in O2 and SF6 microwave plasma etching of polymers. □□May 1990□□Journal of Applied Physics□□American institute of Physics.*

D. Fuard, O. Joubert, L. Vallier, and M. Bonvalot□□High density plasma etching of low k dielectric polymers in oxygen-based chemistries□□Mar./Apr. 2001□□Journal of Vacuum Science and Technology B□□American Vacuum Society.*

* cited by examiner

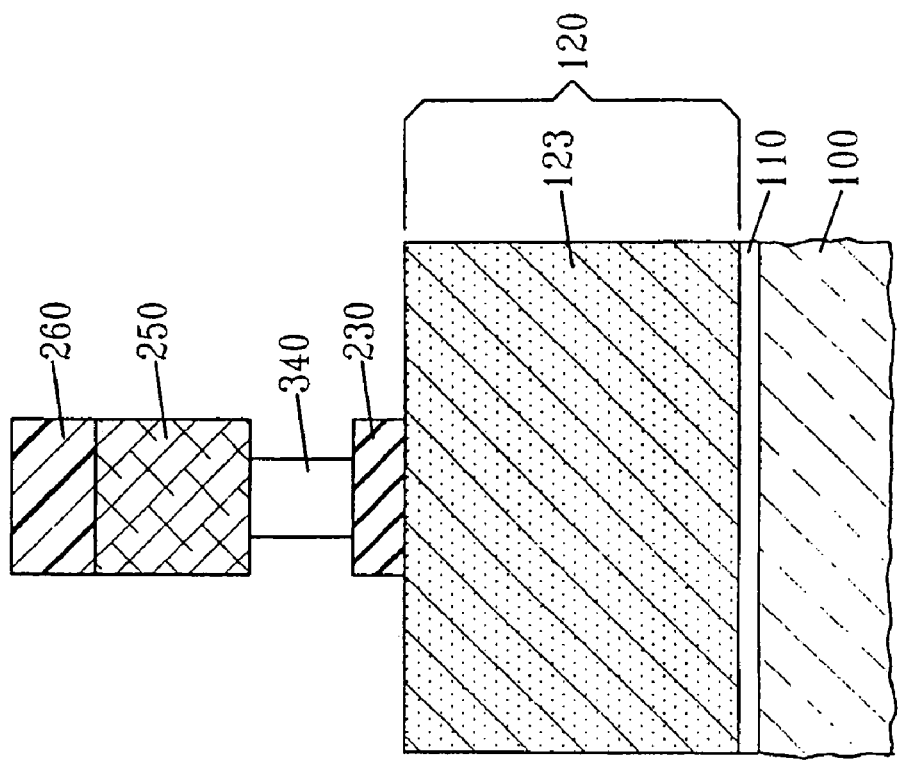
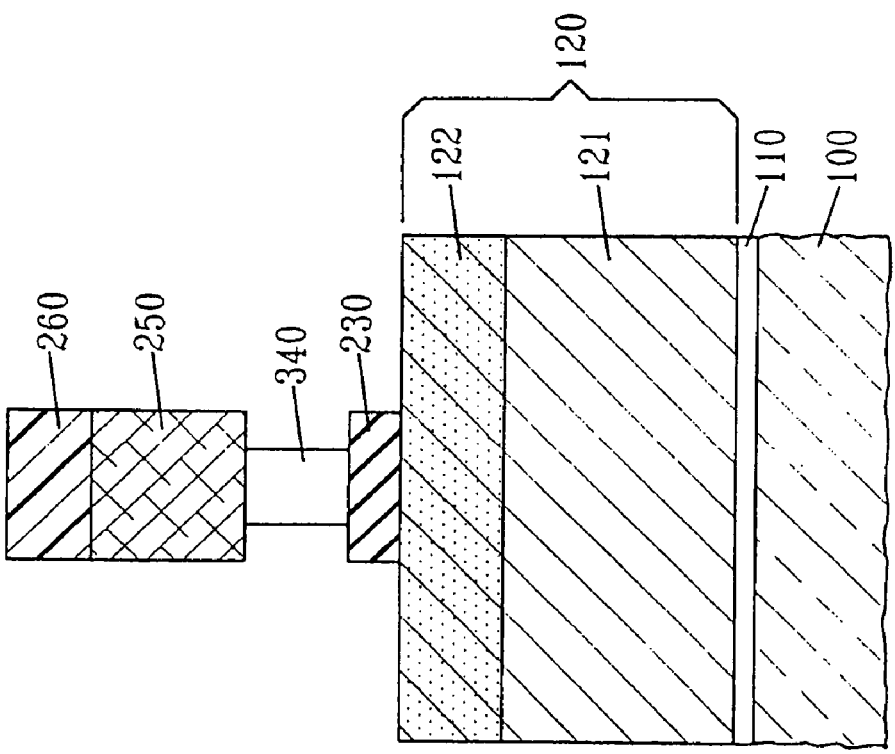

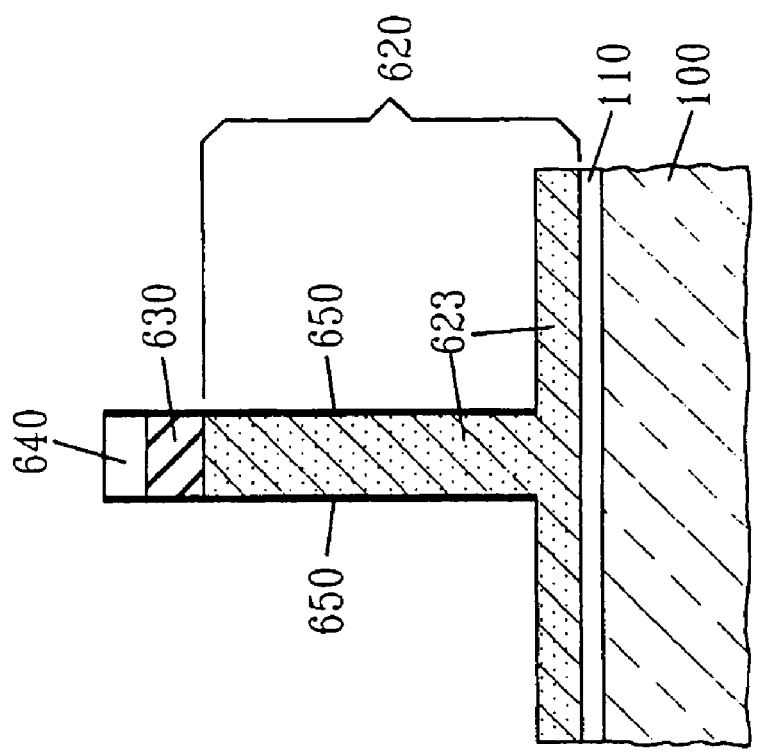
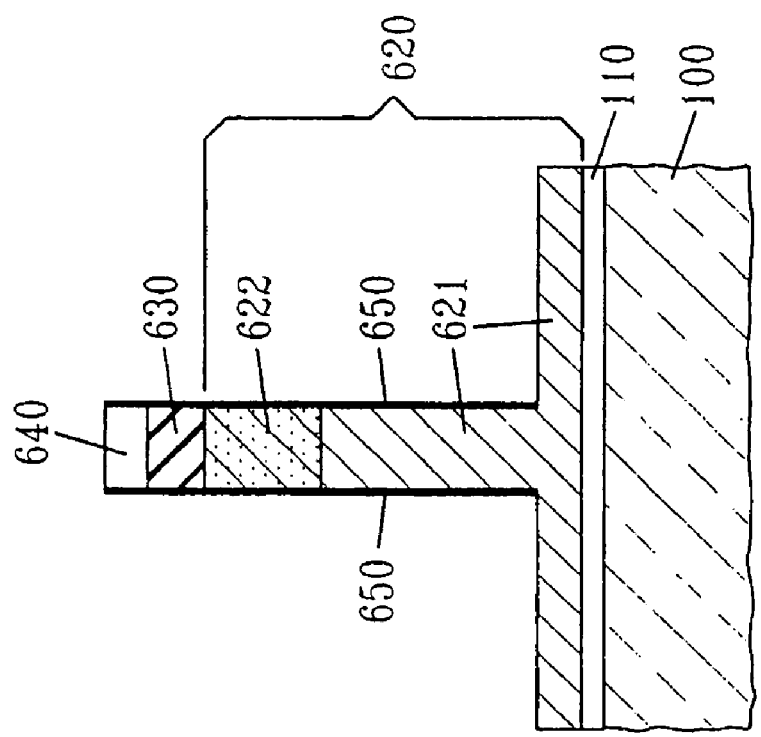

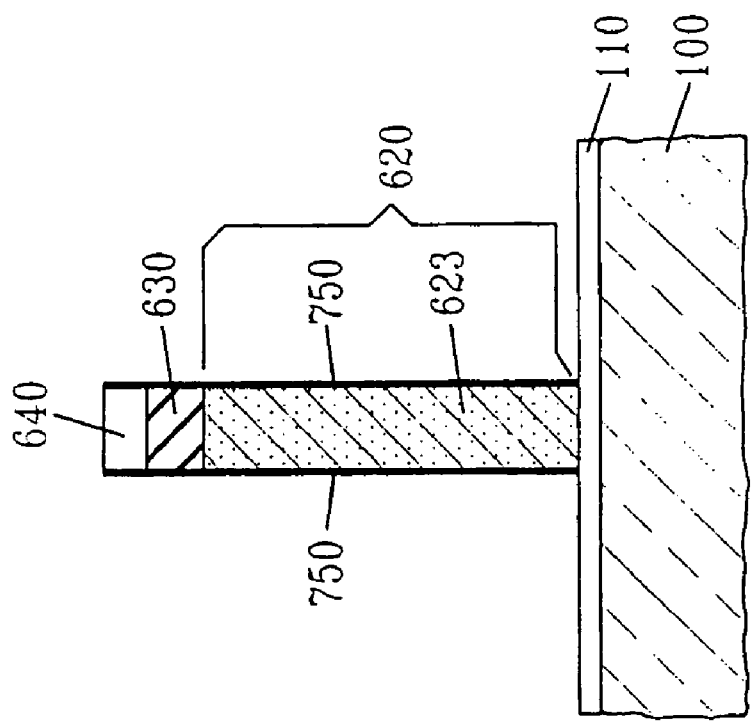
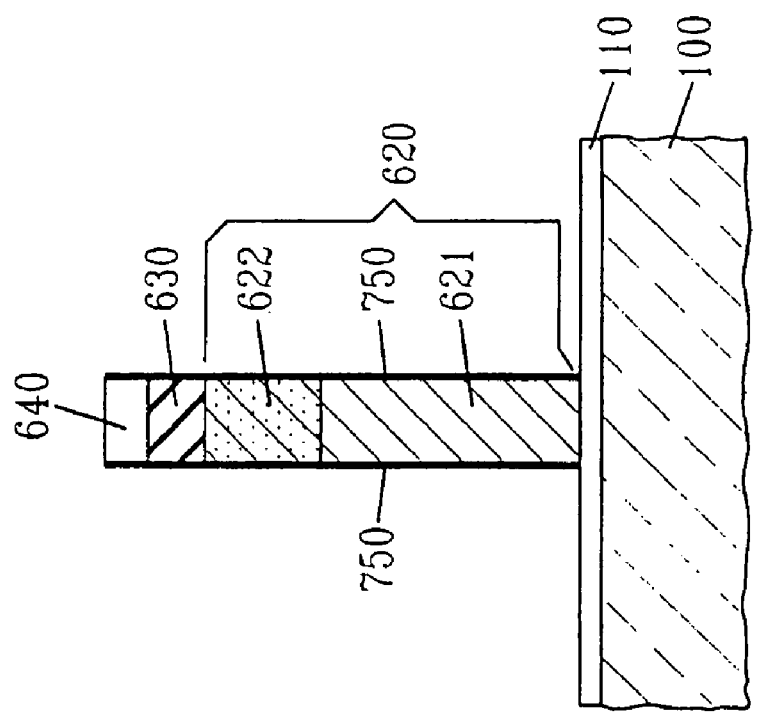

US 7,344,965 B2

METHOD OF ETCHING DUAL PRE-DOPED POLYSILICON GATE STACKS USING CARBON-CONTAINING GASEOUS ADDITIONS

FIELD OF THE INVENTION

This invention relates to methods of etching gate stacks used, for example, in complementary metal oxide semiconductor (CMOS) devices and metal oxide semiconductor field effect transistors (MOSFETs). In particular, this invention relates to the use of gas phase carbon containing sources to provide etching by-products to passivate the sidewalls of gate stacks.

BACKGROUND OF THE INVENTION

As gate technology has advanced, circuit elements of semiconductor devices have been designed to be smaller and more densely packed. In the fabrication of gate stacks of such diminishing dimensions, such as, for example, stacks with gate lengths of less than 50 nm, two kinds of masks, known as "soft masks" (SM) and "hard masks" (HM) are increasingly used in the same fabrication process.

Soft masks typically comprise a photoresist (PR) material, which allows for patterning through conventional lithographic techniques using radiation. Hard masks, in turn, often comprise silicon-based materials such as for example, silicon oxides, silicon nitrides, silicon oxynitirides, and combinations or multilayers thereof. For example, one type of silicon-based material often used in hard mask applications is tetraethylorthosilicate (TEOS). Hard masks can, for example, serve to extend the resist budget of masking materials, provide for greater critical dimension (CD) control, and offer carbon free etching for better gate oxide selectivity.

Dual pre-doped gate stacks comprise a conductive material, such as polysilicon (poly-Si), doped with either n+ type dopants (such as, for example, P, N, As, Sb, and Bi) or p+ type dopants (such as, for example, B, Al, Ga, In, and Tl). The presence of gate stacks with both types of dopants on the same wafer can lead to fabrication challenges that may not necessarily exist with gate stacks having only a single type dopant. For instance, chlorine and bromine based plasmas have conventionally been used to etch poly silicon gate stacks due to their selectivity of etching poly silicon over other gate materials such as silicon oxide. However, when such plasmas are used to etch dual pre-doped stacks, n+ doped regions tend to etch much faster in both vertical and lateral directions than do p+ doped regions. This can result in undesirable profile differences between n+ and p+ doped poly-Si gate stacks.

As compared to chlorine or bromine based plasmas, fluorine based plasmas generally result in much smaller etching rate differences between n+ and p+ doped regions. Thus, in order to obtain minimum profile differences between n+ and p+ poly-Si gate stacks, fluorine based plasmas are generally preferred. However, fluorine based plasmas as compared to chlorine or bromine based plasmas have a much higher etch rate for silicon oxide materials, including hard mask materials such as TEOS. Accordingly, when using fluorine based plasmas to selectively etch poly silicon regions, it is typically necessary to mask off regions that comprise materials such as silicon oxide.

One method of masking silicon oxide regions during poly-Si etching, involves using carbon containing sources from the soft mask photoresist material. These carbon containing sources not only serve to protect hard mask material such as TEOS from being etched during poly-Si etching but can also serve as passivation layers on gate stack sidewalls, thereby resulting in straighter gate stacks. When such passivation material is not present, 'necking' can occur, for example, in the interface between pre-doped and non-doped Poly-Si layers.

Certain disadvantages, however, may result when using soft mask photoresist material as the major source to passivate gate sidewalls and block hard mask etching. Specifically, there may be processing steps where the presence of carbon containing sources from such material is generally not desirable.

For example, under certain processing conditions, carbon containing sources from photoresist material may react with material used to insulate the underlying substrate (often referred to as "gate oxide" material), thereby at least partially exposing the substrate. If these conditions are also favorable to etching the substrate (such as, for example, when the substrate comprises Si and a Br based plasma is being used), the integrity of the substrate, and hence the entire device, may be compromised.

In addition, as discussed above, one of the advantages for using a hard mask material is that it allows for reduced line width dimensions with better CD control than when soft mask alone is used. One method of obtaining such result involves trimming hard mask material using a process called chemical oxide reduction (COR). COR allows for the etching of hard mask material such as TEOS in a self limiting reaction, which occurs under particular process conditions involving, for example, hydrogen fluoride and ammonia. See e.g., U.S. Pat. No. 5,876,879, the entire disclosure of which is incorporated herein by reference. When carbon containing sources from soft mask photoresist material are continuously preserved and used to protect hard mask material during subsequent processing, conditions are not favorable for COR.

Accordingly, there is a continued need for methods of etching dual pre-doped gates that may overcome at least one disadvantage as discussed above.

SUMMARY OF THE INVENTION

The present invention relates to methods for making dual-pre doped gate stacks for use in semiconductor applications. Specifically, the present invention relates to methods for making dual pre-doped gate stacks comprising: (i) providing at least one pre-doped conductive layer on a gate stack, wherein said gate stack comprises a substrate and at least one gate dielectric provided on said substrate, and (ii) etching said at least one conductive layer by exposing it to an etching composition, wherein said etching composition comprises at least one carbon containing gas. In addition to the at least one carbon containing gas, the etching composition may, for example, further comprise at least one halogen based plasma and at least one gas selected from $O_2$ and $N_2$.

The at least one carbon containing gas may, for example, comprise gases having the chemical formula $C_xH_y$, wherein x is an integer ranging from 1 to 10, and Y is an integer ranging from 2 to 22. The at least one carbon containing gas may also comprise gases having the chemical formula $C_xH_yA$, wherein x is an integer ranging from 1 to 10, Y is an integer ranging from 0 to 21, and A represents at least one additional substitient selected the group consisting of O, N, S, P, F, Cl, Br, I, and combinations of the same. The at least one carbon containing gas may additionally comprise gases having the chemical formula $C_xH_yA$, wherein x is an integer ranging from 1 to 10, Y is an integer ranging from 2 to 21, and A represents at least one additional substitient selected the group consisting of O, N, S, P, F, Cl, Br, I, and combinations of the same, or gases having the chemical formula $C_xH_yA$, wherein x is an integer ranging from 1 to 10, Y is an integer ranging from 0 to 21, and A represents at least one additional substitient selected the group consisting of O, N, S, P, Cl, Br, I, and combinations of the same.

The present invention further relates to dual-pre doped gate stacks made by processes according to the invention. Such gate stacks can have a width of at least about 3 nm, such as a width ranging from about 5 nm to about 150 nm, with essentially vertical sidewalls.

BRIEF DESCRIPTION OF THE DRAWINGS

These and other features of the present invention will become apparent upon consideration of the following detailed description of the invention when read in conjunction with the drawings, in which:

FIG. 3 shows, in cross sectional view, the gate stack of FIG. 2 following a hardmask thinning process, such as COR;

FIG. 6 shows, in cross sectional view, the gate stack of FIG. 5 following etching of conductive layer(s) using an etching composition comprising carbon containing gases;

FIG. 7 shows, in cross sectional view, the gate stack of FIG. 6 following an over etch (OE) step used to remove the remainder of conductive layer(s)

DETAILED DESCRIPTION OF THE INVENTION

Figure 1B:
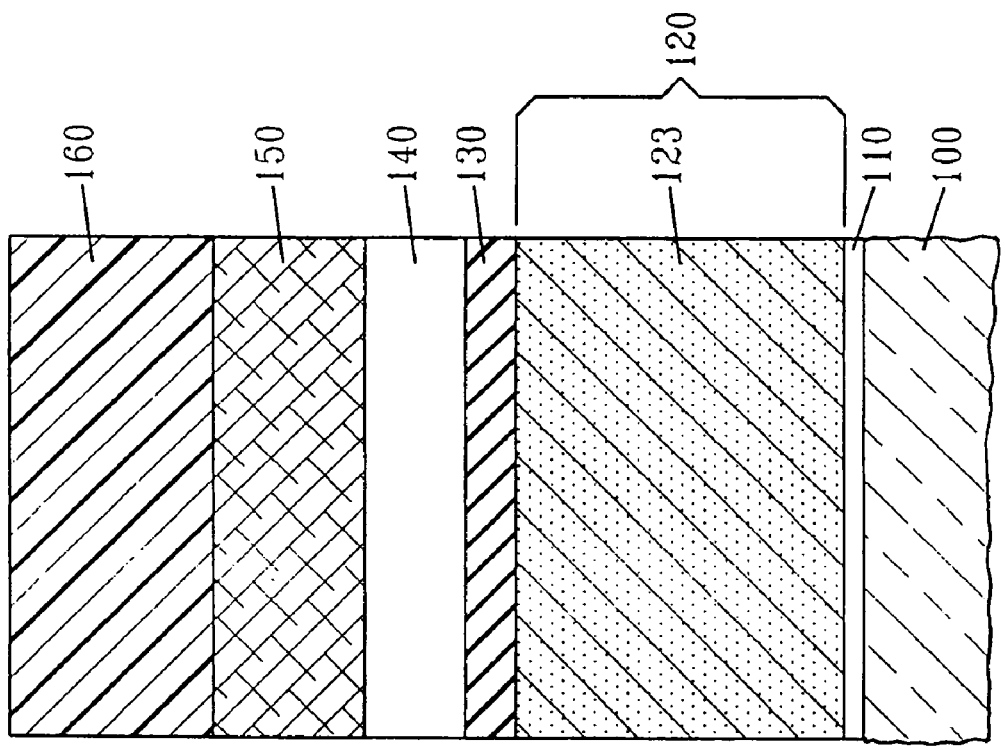
FIG. 1 shows, in cross sectional view, the starting structure of a pre-doped gate stack comprising either an n+ or p+ type dopant.

The present invention relates to methods of etching of dual pre-doped gate stacks using gas phase carbon containing sources to provide etching by-products to passivate gate sidewalls. In particular, the present invention relates to using an etching composition comprising a controlled stream of carbon containing gas, instead of, for example, carbon from photoresist masks, as the primary passivation source. The invention allows for such gas to be turned "on" and "off" during or between processing steps, thereby allowing for its application in certain processing steps where its presence may be advantageous and limiting it in other steps where its presence may not be advantageous.

As used herein, the term "pre-doped" refers to conductive materials, such as, for example, polysilicon (poly-Si), that have been doped with either an n+ or p+ type dopant prior to being deposited on a gate stack.

As used herein, the term "dual pre-doped gate stacks" refers to n+ and p+ pre-doped gate stacks that are deposited on the same wafer.

As used herein, the term "etching composition" refers to a composition that is useful in etching gate stacks. Such composition, can for example, comprise any halogen-based plasma (F, Cl, Br, or I) in the presence of a gas such as $O_2$ or $N_2$. This composition, as discussed in further detail below, also comprises at least one carbon-containing gas.

The carbon-containing gas or gases used in the present invention can, for example, include any gases of the general formula $C_xH_y$, where x can be, for example, an integer ranging from 1 to 10, and y can be, for example, an integer ranging from, for example, 2 to 22. The carbon-containing gas or gases may also include gases of the formula $C_xH_yA$, wherein x can, for example, be an integer ranging from 1 to 10, y can, for example, range from 0 to 21, and A can represent at least one additional organic substituent such as, for example, O, N, S, P, F, Cl, Br, I, and combinations of one or more of the same. The carbon containing gas may additionally comprise gases having the chemical formula $C_xH_yA$, wherein x is an integer ranging from 1 to 10, Y is an integer ranging from 2 to 21, and A represents at least one additional substitient selected the group consisting of O, N, S, P, F, Cl, Br, I, and combinations of the same, or gases having the chemical formula $C_xH_yA$, wherein x is an integer ranging from 1 to 10, Y is an integer ranging from 0 to 21, and A represents at least one additional substitient selected the group consisting of O, N, S, P, Cl, Br, I, and combinations of the same.

Examples of carbon-containing gases that may be used in the present invention include, but are not limited to $CH_4$, $C_2H_2$, $C_2H_4$, $C_2H_6$, $C_3H_6$, $C_3H_8$, $C_4H_{10}$, $C_5H_{12}$, $C_5H_{10}$, $C_6H_{14}$, $C_6H_{12}$, $C_6H_{10}$, $C_6H_6$, $CH_3OH$, $C_2H_5OH$, $C_3H_7OH$, $CH_3Cl$, and $CH_2Cl_2$.

In one embodiment, the processes of the present invention may be used in obtaining dual pre-doped gate stacks with substantially vertical sidewalls having reduced line widths, ranging from, for example, at least about 3 nm, such as from about 5 nm to about 150 nm. By "substantially vertical sidewalls" it is meant sidewalls having a sidewall angle of 90° ±about 1°, such as from about 89° to about 91°.

A process falling within the scope of the invention is illustrated in FIGS. 1-8. Each of these figures is divided into A and B portions (i.e., FIG. 1A, 1B, 2A, 2B, etc.), representing two optional means of carrying out processes corresponding to the invention. Processes corresponding to the A figures are performed using layers of (i) pre-doped conductive material, such as, for example either n+ or p+ pre-doped poly-Si, and (ii) essentially non-doped conductive material, wherein the layers have not been annealed prior to being deposited. Processes corresponding to the B figures, in turn, are performed using pre-doped conductive material that has been annealed prior to depositing.

FIG. 1 shows an initial structure relating to the invention. This structure comprises semiconductor substrate 100 and gate dielectric 110 deposited thereon. The substrate is not limited to any particular material and may comprise any of a number of materials, or combinations of materials, suitable for use as a substrate. Such materials, may, for example, include Si, Ge, SiGe, GaAs, InAs, InP, and multilayers, alloys, and combinations of the same. A preferred substrate material is Si.

Gate dielectric 110 can be formed on a surface of substrate 100 utilizing any conventional deposition process including, for example, chemical vapor deposition (CVD), plasma-assisted CVD, plasma assisted oxidation, thermal deposition, atomic layer CVD, evaporation, sputtering, remote plasma nitridization (RPN), and chemical solution deposition. Gate dielectric 110 is not limited to any particular material may comprise any number of materials, or combinations of materials, suitable for use as a gate dielectric. For example, gate dielectric 110 may comprise any conventional dielectric material such as, for example, silicon oxides, silicon nitrides, silicon oxynitrides and mixtures, alloys, or multilayers thereof. It may also comprise a high-k material such as, for example, $HfO_2$, $ZrO_2$, $HfSiO_2$, $ZrSiO_2$, AlSi, and mixtures, alloys, or multilayers thereof. A preferred material for the gate dielectric is $SiO_2$.

The physical thickness of gate dielectric 110 may vary. It can, for example, range from about 0.5 nm to about 20 nm, such as from about 0.5 nm to about 5 nm.

After forming the gate dielectric on a surface of the substrate, conductive layer 120 can be formed on a surface of gate dielectric 110. The conductive layer is not limited to any particular material suitable for use in the main conductive region and may comprise, for example, at least one conductive material selected from Si, Ge, SiGe, SiGeC, and mixtures, alloys, and multilayers of the same (as disclosed herein, with materials such as SiGe or SiGeC, the stoicheometric ratio of Si, Ge, and/or C is understood as not being limited to 1; instead SiGe or SiGeC define materials having any ratio or combination of Si, Ge, and/or C). A preferred material for conductive layer 120 is poly-Si. The dopants used in the conductive layer include those commonly employed in the art. Examples of p+ type dopants include B, Al, Ga, In, and Tl. Examples of n+ type dopants include P, N, As, Sb, and Bi.

Figure 1A:
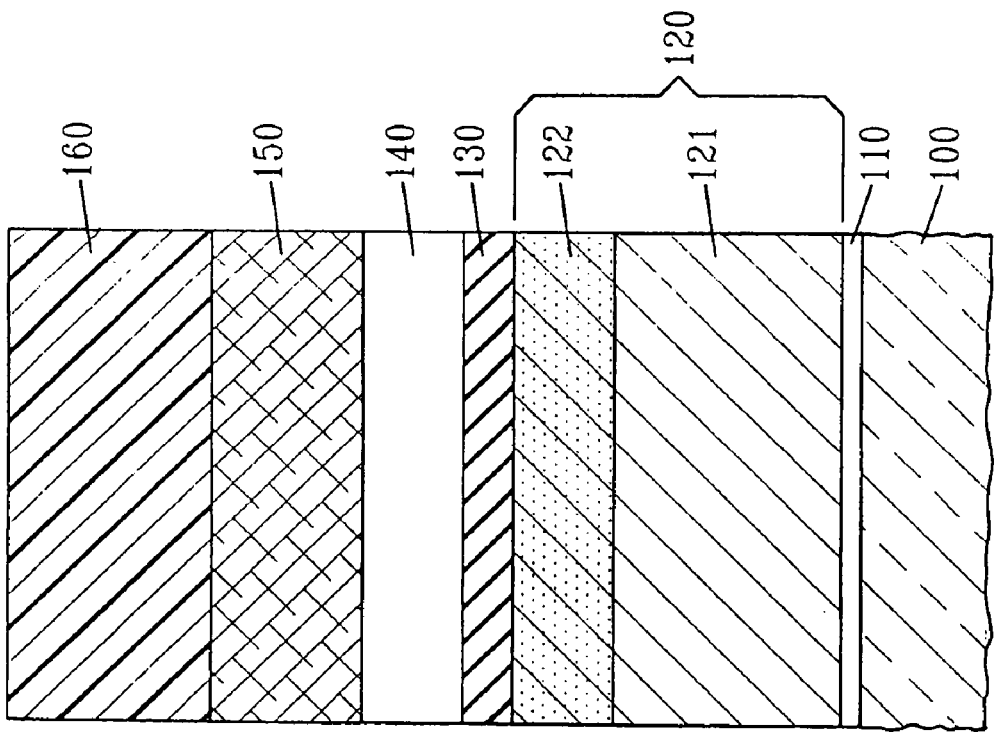

FIG. 1A represents a gate stack in which non-doped and pre-doped conductive material has been deposited prior to annealing, resulting in essentially non-doped 121 and pre-doped 122 regions. FIG. 1B represents a gate stack in which conductive material has been deposited after annealing, resulting in generally uniformly pre-doped region 123.

Conductive layer 120 may be formed utilizing any conventional deposition process and is not limited to any particular process. Processes for forming conductive layer 120 include, for example, CVD, plasma-assisted CVD, sputtering, evaporation, chemical solution deposition, plating, and an in-situ or ex-situ doping deposition processes.

The physical thickness of conductive layer 120 may vary. It can, for example, range from about 20 nm to about 400 nm, such as from about 50 nm to about 200 nm. When conductive layer 120 is deposited as pre-doped 121 and essentially non-doped 122 layers as represented in FIG. 1A, the physical thickness of pre-doped layer 121 may, for example, range from about 10 nm to about 100 nm and the physical thickness of essentially no-doped layer 122 may, for example, range from 10 nm to about 390 nm.

After depositing conductive layer 120, at least one hardmask layer may be added. The hardmask layer or layers may preferably comprise at least one layer 130 selective for post-etch cleaning treatment and at least one layer 140 that is essentially removed during post-etch cleaning treatment ("post-etch cleaning treatment" is described in more detail below, with reference to FIG. 8).

The at least one layer 130 selective for post-etch cleaning treatment can, for example, comprise any material that would not be significantly removed or etched during post-etch cleaning treatment, including, but not limited to silicon nitride, silicon carbide, silicon hydrogenated carbide, silicon oxidized carbide, silicon nitridized carbide, and mixtures, multilayers, or alloys thereof. A preferred material for layer 130 is silicon nitride. This layer can be formed, for example, using any conventional deposition process, including, but not limited to, chemical vapor deposition (CVD), plasma-assisted CVD, plasma assisted oxidation, thermal deposition, atomic layer CVD, evaporation, sputtering, remote plasma nitridization (RPN), and chemical solution deposition.

The physical thickness of layer 130 may vary. It can, for example, range from about 10 nm to about 100 nm.

After depositing layer 130, a layer of hardmask material 140 susceptible to removal during post-etch cleaning treatment can be deposited. This layer may, for example, include, an oxide, nitride, oxynitride, and/or carbamide of silicon, and mixtures, alloys, or multilayers thereof. A preferred material for layer 140 is tetraethylorthosilicate (TEOS).

Layer 140 may be applied and patterned using any conventional processing steps known in the art. For example, layer 140 may be applied using CVD, plasma-assisted CVD, evaporation, chemical solution deposition, and other like deposition processes. In addition, a conventional thermal growing process may be employed in forming layer 140.

The physical thickness of layer 140 may vary. It can, for example, range from about 10 nm to about 150 nm.

After depositing layer 140, a layer of anti-reflective coating (ARC) 150 can be added. The ARC layer may comprise any organic-based material known suitable for ARC. ARC 150 can be deposited, for example, by CVD, plasma-assisted CVD, evaporation, chemical solution deposition, and other like deposition processes. The physical thickness of the ARC may vary, and can be, for example, from about 20 nm to about 150 nm.

Following application of ARC layer 150, a layer of softmask photoresist material 160 can be added. This material may include, for example, any conventional organic-based photoresist material. The photoresist material 160 can be deposited, for example, by CVD, plasma-assisted CVD, evaporation, chemical solution deposition, and other like deposition processes. The physical thickness of the photoresist material may vary, such as, for example from about 40 nm to about 600 nm. The photoresist material can be patterned using any methods known in the art, such as, for example, conventional lithography.

Figure 2B:
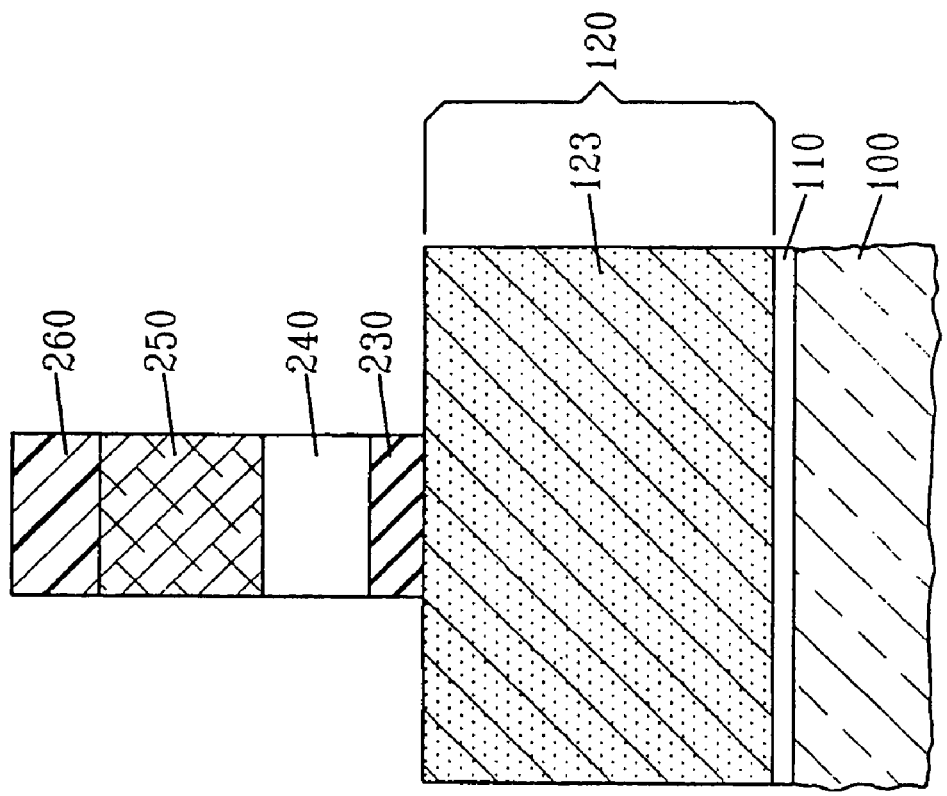
FIG. 2 shows, in cross sectional view, the gate stack of FIG. 1 following trim of softmask photoresist, and opening of ARC and hardmask layers.
Figure 2A:
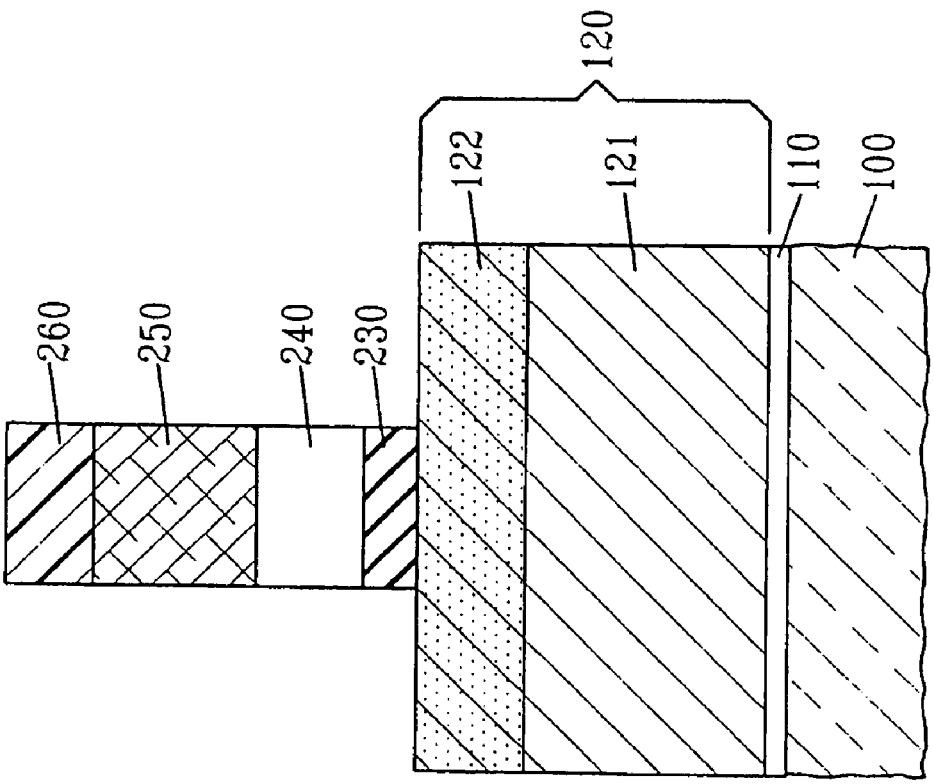

FIG. 2 shows the gate stack of FIG. 1, including substrate 100, gate dielectric 110, conductive layer 120 (including essentially non-doped 121 and pre-doped 122 regions in FIG. 2A, and generally uniformly pre-doped region 123 in FIG. 2B), following trimming of photoresist 260, and opening of ARC 250 and hardmask layers 240 and 230. The photoresist and ARC can be etched, for example, using any technique available in the art such as, for example, with $O_2$, $N_2$, $CF_4$, $Cl_2$, and HBr based chemistries, including combinations of those chemistries. The hardmask layers may be etched, for example, using any fluorine based chemistry, such as, for example, $CF_4$, $CHF_3$, $CH_2F_2$, $CH_3F$, $SF_6$, and $NF_3$, including combinations of those chemistries. The width of photoresist 260, ARC 250, and hardmask layers 240 and 230, as shown in FIG. 2 may vary, and may range from, for example, at least about 3 nm, such as from about 5 nm to about 150 nm.

FIG. 3 shows the gate stack of FIG. 2, including substrate 100, gate dielectric 110, conductive layer 120 (including essentially non-doped 121 and pre-doped 122 regions in FIG. 3A, and generally uniformly pre-doped region 123 in FIG. 3B) photoresist 260, ARC 250, and hardmask 230, following further trimming of hardmask layer 340, using a process useful for selectively trimming such layer, such as, for example, chemical oxide reduction (COR). COR is described in detail in U.S. Pat. No. 5,876,879, the entire disclosure of which is incorporated herein by reference, and allows for the etching of hard mask material such as, for example, TEOS in a self limiting reaction, which occurs under particular process conditions involving, for example, hydrogen fluoride and ammonia. The width of hardmask layer 340, as shown in FIG. 3 may vary, and may range from, for example, at least about 3 nm, such as from about 5 nm to about 150 nm.

Figure 4B:
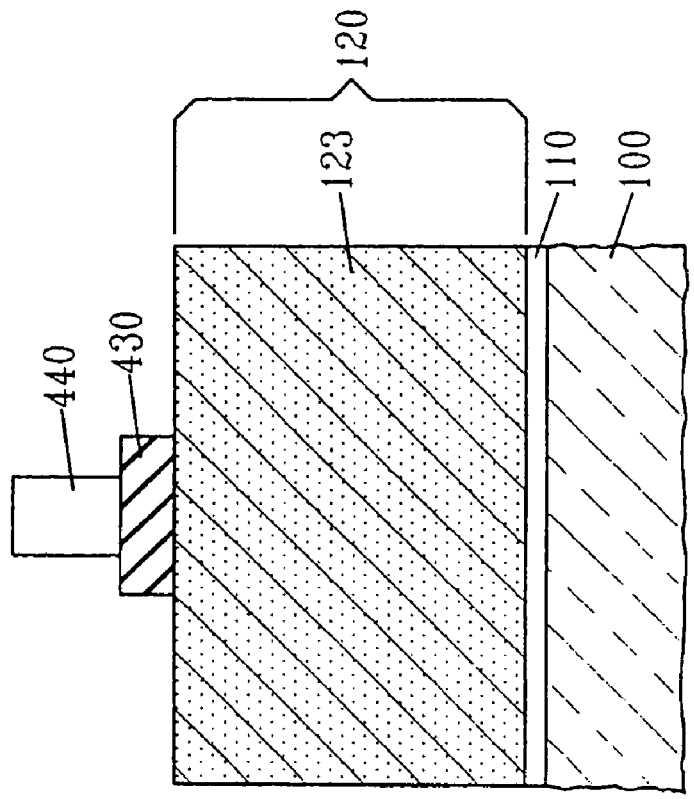
FIG. 4 shows, in cross sectional view, the gate stack of FIG. 3 following the stripping of softmask photoresist and ARC layers.
Figure 4A:
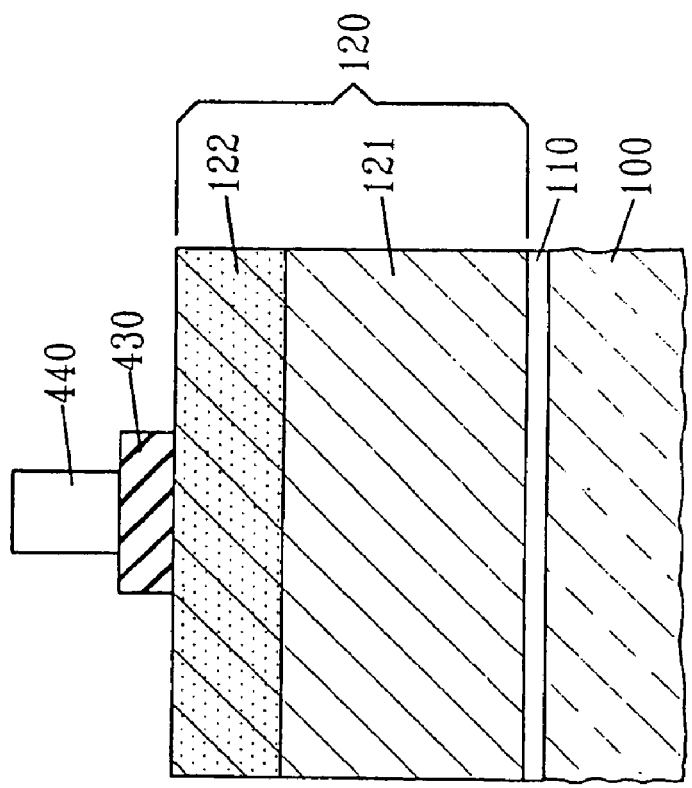

FIG. 4 shows the gate stack of FIG. 3, including substrate 100, gate dielectric 110, conductive layer 120 (including essentially non-doped 121 and pre-doped 122 regions in FIG. 4A, and generally uniformly pre-doped region 123 in FIG. 4B), and hardmask layers 430 and 440, following removal of photoresist and ARC. Removal of photoresist and ARC can be carried out through any method known in the art, such as, for example, a resist stripping process using $O_2$, $N_2$, $CF_4$, $Cl_2$, or HBr based chemistries, including combinations of those chemistries.

Figure 5B:
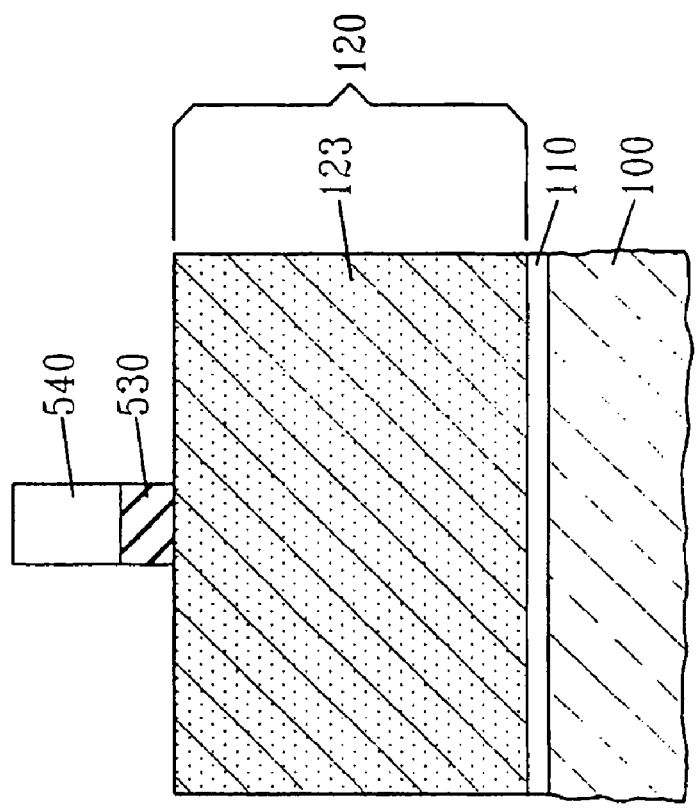
FIG. 5 shows, in cross sectional view, the gate stack of FIG. 4 after a second hardmask layer is used to pattern a first hardmask layer.
Figure 5A:
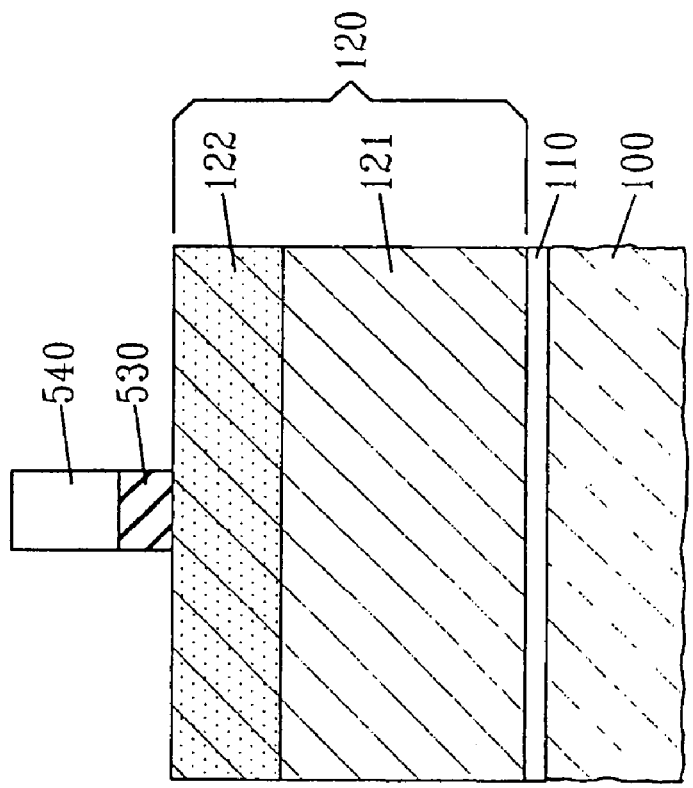

FIG. 5 shows the gate stack of FIG. 4, including substrate 100, gate dielectric 110, conductive layer 120 (including essentially non-doped 121 and pre-doped 122 regions in FIG. 5A, and generally uniformly pre-doped region 123 in FIG. 5B), after hardmask layer 530 is trimmed while being masked by hardmask layer 540. Etching of hardmask layer 530 can be carried out by using any process known for selectively etching materials described above as being useful for hardmask layer 530, while being generally selective to materials used in hardmask layer 540, such as TEOS, and generally selective to materials useful for conductive layer 120. Such process can include, for example, use of a plasma containing a hydrogenated fluorocarbon, such as $CH_2F_2$ and/or $CH_3F$ in the presence of $O_2$ or $Cl_2$. The width of hardmask layers 530 and 540, as shown in FIG. 5 may vary, and may range from, for example, at least about 3 nm, such as from about 5 nm to about 150 nm.

FIG. 6 shows the gate stack of FIG. 5, including substrate 100 and gate dielectric 110, following etching of conductive layer 620 (including essentially non-doped 621 and pre-doped 622 regions in FIG. 6A, and generally uniformly pre-doped region 623 in FIG. 6B) while being masked by hardmask layers 630 and 640. Etching of conductive layer 620, can be accomplished by utilizing an etching composition comprising at least one carbon containing gas. In addition to the at least one carbon containing gas, such etching composition, can for example, comprise at least one of any halogen-based plasma (i.e. an F, Cl, Br, or I based plasma) or mixtures of the same, in the presence of a gas, such as $O_2$ or $N_2$, or mixtures of the same.

The carbon-containing gas or gases used in the present invention can include any gases of the general formula $C_xH_y$, where x can be, for example, an integer ranging from 1 to 10, and y can be, for example, an integer ranging from, for example, 2 to 22. The carbon-containing gas or gases may also include gases of the formula $C_xH_yA$, wherein x can, for example, be an integer ranging from 1 to 10, y can, for example, range from 0 to 21, and A can represent at least one additional organic substituent such as, for example, O, N, S, P, F, Cl, Br, I, and combinations of one or more of the same. The carbon containing gas may additionally comprise gases having the chemical formula $C_xH_yA$, wherein x is an integer ranging from 1 to 10, Y is an integer ranging from 2 to 21, and A represents at least one additional substituent selected the group consisting of O, N, S, P, F, Cl, Br, I, and combinations of the same, or gases having the chemical formula $C_xH_yA$, wherein x is an integer ranging from 1 to 10, Y is an integer ranging from 0 to 21, and A represents at least one additional substitient selected the group consisting of O, N, S, P, Cl, Br, I, and combinations of the same.

The carbon containing gases are not limited to any particular class of chemical compounds and can include, for example, aliphatic, aromatic, linear and branched compounds and/or groups including, for example, alkanes, alkenenes, alkynes, dienes, arenas, alkyl halides, alkenyl halides, aryl halides, alcohols, phenols, ethers, epoxides, aldehydes, ketones, carboxylic acids, acyl halides, acid anhydrides, esters, amides, amines, nitriles, thiols, and sulfides. Examples of carbon-containing gases that may be used in the present invention include, but are not limited to $CH_4$, $C_2H_2$, $C_2H_4$, $C_2H_6$, $C_3H_6$, $C_3H_8$, $C_4H_8$, $C_4H_{10}$, $C_5H_{12}$, $C_5H_{10}$, $C_6H_{14}$, $C_6H_{12}$, $C_6H_{10}$, $C_6H_6$, $CH_3OH$, $C_2H_5OH$, $C_3H_7OH$, $CH_3Cl$, and $CH_2Cl_2$. Examples of halogen based plasmas that may be used in the present invention can include, but are not limited to $CF_4$, $CHF_3$, SF6, $NF_3$, $Cl_2$, $BCl_3$, HBr, $Br_2$, and $I_2$.

The carbon containing gas can be present in the etching composition in an amount ranging from about 0.1% to about 50% by volume, based on the total volume of the etching composition, such as from about 5% to about 15% by volume, based on the total volume of the etching composition.

The carbon containing gas used in the etching composition should allow for the formation of passivation layers 650 on the gate stack sidewalls, as shown in FIG. 6. These passivation layers may, for example, comprise any number of passivating precursors and/or compound species including, but not limited to, C, Si, O, N, and/or some F, Cl, Br, and/or I.

The ability of materials comprising the passivation layers 650 to adhere to gate stack sidewalls, or so-called "sticking probability", determines the thickness of the passivation layers and is a function of both the etching composition and the materials making up the gate stack. The selection of the etching composition should preferably result in a sticking probability that allows for gate stacks having essentially vertical sidewalls, and should further preferably allow for etching of the conductive material to an average width that is substantially similar to the width of hardmask layers 630 and 640. For example, when the conductive layer of the gate stack comprises poly-Si, the carbon containing gas in the etching composition is most preferably selected from carbon containing gases having a high C to H ratio. Such gases may, for example, include but are not limited to $C_2H_2$, $C_2H_4$, and $C_3H_6$.

The width of conductive layer 620, as shown in FIG. 6 may vary, and may range from, for example, at least about 3 nm, such as from about 5 nm to about 150 nm.

The process illustrated by the gate stack in FIG. 6 should preferably allow for a thin layer of conductive material 620 (621 in FIG. 6A and 623 in FIG. 6B) to be left to cover gate dielectric 110. This layer of conductive material allows the gate dielectric 110 to be generally protected from potential reaction with components of the etching composition, thereby allowing the gate dielectric to protect the substrate 100 in the step illustrated by FIG. 7. This layer may, for example, range from about 10 nm to about 30 nm deep.

FIG. 7 shows the gate stack of FIG. 6, including substrate 100, gate dielectric 110, conductive layer 620 (including essentially non-doped 621 and pre-doped 622 regions in FIG. 6A, and generally uniformly pre-doped region 623 in FIG. 6B), and hardmask layers 630 and 640, after the gate stack is subjected to an "over etch" (OE) step. The OE step can generally be carried out using a Br and/or Cl based plasma in the presence of $O_2$ and/or $N_2$. The OE step allows the exposure of the gate dielectric 110 by removal of the conductive material 620 (illustrated as 621 in FIG. 6A and 623 in FIG. 6B). This step may also change the chemical composition and/or thickness of passivation layers 750.

The plasma used in the OE step should preferably be essentially free of carbon containing gases used in the etching composition of the previous step. By "essentially free of carbon containing gases", the plasma used in the OE step should comprise less than 0.1% by volume of the carbon containing gases used in the etching composition of the previous step.

Figure 8B:
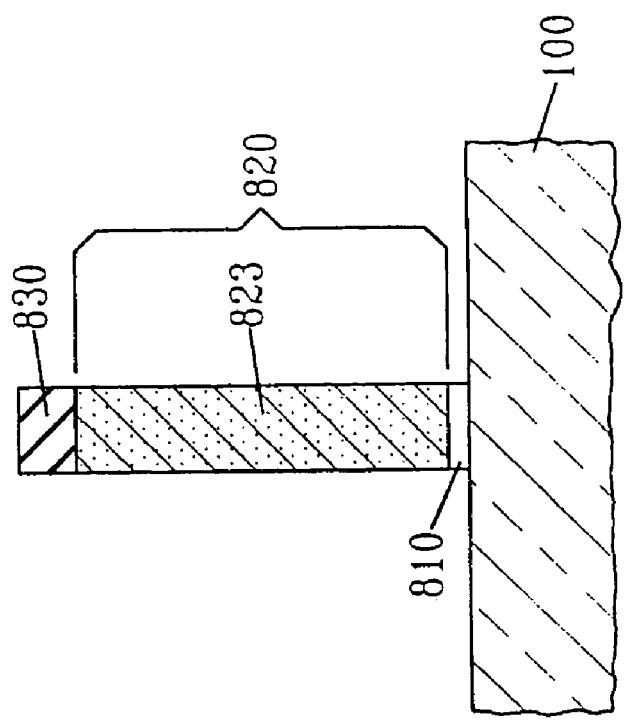
FIG. 8 shows, in cross sectional view, the gate stack of FIG. 7 following a post-etch cleaning treatment.
Figure 8A:
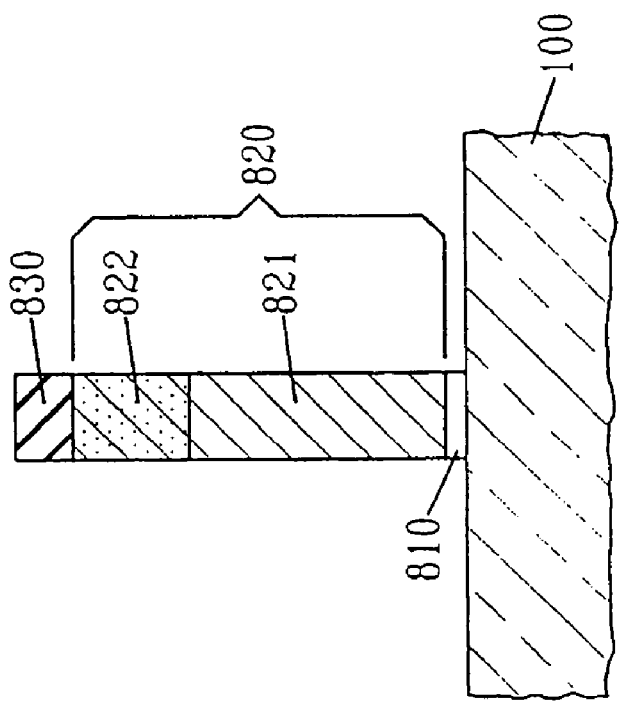

FIG. 8 shows the gate stack of FIG. 7, including substrate 100, after the gate stack has been exposed to a "post-etch cleaning" treatment. A post-etch cleaning treatment can comprise, for example, exposing the gate stack to a fluoride based plasma, such as, for example HF. The post-etch cleaning treatment serves to essentially open gate dielectric 810, remove hardmask layer 640 (in FIG. 7), remove passivating layers 750 (in FIG. 7), thereby leaving conductive layer 820 (including essentially non-doped 821 and pre-doped 822 regions in FIG. 8A, and generally uniformly pre-doped region 823 in FIG. 8B), and hardmask layer 830.

The width of conductive layer 820, as shown in FIG. 6 may vary, and may range from, for example, at least about 3 nm, such as from about 5 nm to about 150 nm.

Gate dielectric 110 can be formed on a surface of substrate 100 utilizing any conventional deposition process including, for example, chemical vapor deposition (CVD), plasma-assisted CVD, plasma assisted oxidation, thermal deposition, atomic layer CVD, evaporation, sputtering, remote plasma nitridization (RPN), and chemical solution deposition. Gate dielectric 110 is not limited to any particular material may comprise any number of materials, or combinations of materials, suitable for use as a gate dielectric. For example, gate dielectric 110 may comprise any conventional dielectric material such as, for example, silicon oxides, silicon nitrides, silicon oxynitrides and mixtures, alloys, or multilayers thereof. It may also comprise a high-k material such as, for example, $HfO_2$, $ZrO_2$, $HfSiO_2$, $ZrSiO_2$, AlSi, and mixtures, alloys, or multilayers thereof. A preferred material for the gate dielectric is $SiO_2$.

What is claimed as new and desired to be protected by Letters Patent of the United States is:

1. A method for making dual pre-doped gate stacks comprising:
   (i) providing at least one pre-doped conductive layer on a gate stack, wherein said gate stack comprises a substrate and at least one gate dielectric provided on said substrate, and
   (ii) etching said at least one conductive layer by exposing it to an etching composition, wherein said etching composition comprises: at least one carbon containing gas; a halogen-based plasma; and a gas selected from the group consisting of $O_2$, $N_2$, and mixtures of the same; wherein the carbon containing gas is selected from the group consisting of:
      (i) gases having the chemical formula $C_x H_y$, wherein x is an integer ranging from 1 to 10, and Y is an integer ranging from 2 to 22; and
      (ii) gases having the chemical formula $C_x H_y A$, wherein x is an integer ranging from 1 to 10, Y is an integer ranging from 0 to 21, and A represents at least one additional substitient selected the group consisting of O, N, S, P, F, Cl, Br, I, and combinations of the same.

2. The method of claim 1, wherein the halogen based plasma is selected from the group consisting of $CF_4$, $CHF_3$, $SF_6$, $NF_3$, $Cl_2$, $BCl_3$, HBr, $Br_2$, $I_2$ and mixtures of the same; and the carbon containing gas is selected from the group consisting of $CH_4$, $C_2H_2$, $C_2H_4$, $C_2H_6$, $C_3H_6$, $C_3H_8$, $C_4H_8$, $C_4H_{10}$, $C_5H_{12}$, $C_5H_{10}$, $C_6H_{14}$, $C_6H_{12}$, $C_6H_{10}$, $C_6H_6$, $CH_3OH$, $C_2H_5OH$, $C_3H_7OH$, $CH_3Cl$, $CH_2C_{12}$, and mixtures of the same.

3. The method of claim 2, wherein the amount of carbon containing gas in the etching composition ranges from about 0.1% to about 50% by volume of the etching composition, based on the total volume of the etching composition.

4. The method of claim 3, wherein the amount of carbon containing gas in the etching composition ranges from about 5% to about 15% by volume of the etching composition, based on the total volume of the etching composition.

5. The method of claim 2, wherein the pre-doped conductive layer comprises a conductive material selected from the group consisting of Si, Ge, SiGe, and SiGeC, and mixtures, alloys, or multilayers of the same.

6. The method of claim 5, wherein the pre-doped conductive layer comprises poly-Si.

7. The method of claim 5, wherein between steps (i) and (ii), the method further comprises:
   providing at least one first hardmask layer on said pre-doped conductive layer, wherein said at least one first hardmask layer comprises at least one hardmask material selected from the group consisting of silicon nitride, silicon carbide, silicon hydrogenated carbide, silicon oxidized carbide, and silicon nitridized carbide, and mixtures, alloys, or multilayers of the same;
   providing at least one second hardmask layer on said at least one first hardmask layer, wherein said at least one second hardmask layer comprises at least one hardmask material selected from the group consisting of silicon oxide, silicon nitride, silicon oxynitride, and silicon carbamide, and mixtures, alloys, or multilayers of the same; and
   etching back said at least one first and said at least one second hardmask layers to a width of at least about 3 nm.

8. The method of claim 7, wherein said first hardmask layer comprises silicon nitride, said second hardmask layer comprises tetraethylorthosilicate (TEOS), and said first and second hardmask layers are etched to a width ranging from about 5 nm to about 150 nm.

9. The method of claim 5, wherein step (ii) comprises etching back said conductive layer to a width of at least about 3 nm.

10. The method of claim 7, wherein step (ii) comprises etching back said conductive layer to a width of at least about 3 nm.

11. The method of claim 10, wherein step (ii) comprises leaving a layer of conductive material having a thickness ranging from about 10 to about 30 nm above said gate dielectric and, following step (ii), the method further comprises:
    exposing the gate dielectric in an over etch (GE) step, wherein said gate is exposed to an GE composition comprising a Br and/or Cl based plasma and a gas selected from $O_2$ and/or $N_2$, and wherein said OE composition is essentially free of said carbon containing gas used in the etching composition of step (ii).

12. The gate stack of claim 11, wherein said gate has a width ranging from about 5 nm to about 150 nm and said conductive material comprises poly-Si.

13. A dual pre-doped gate stack made by a method comprising:
    (i) providing at least one pre-doped conductive layer on a gate stack, wherein said gate stack comprises a substrate and at least one gate dielectric provided on said substrate, and (ii) etching said at least one conductive layer by exposing it to an etching composition, wherein said etching composition comprises: at least one carbon containing gas; a halogen-based plasma; and a gas selected from the group consisting of $O_2$, $N_2$, and mixtures of the same; wherein the carbon containing gas is selected from the group consisting of:
  (i) gases having the chemical formula $C_xH_y$, wherein x is an integer ranging from 1 to 10, and Y is an integer ranging from 2 to 22; and
  (ii) gases having the chemical formula $C_xH_yA$, wherein x is an integer ranging from 1 to 10, Y is an integer ranging from 0 to 21, and A represents at least one additional substitient selected the group consisting of O, N, S, P, F, Cl, Br, I, and combinations of the same.

14. The gate stack of claim 13, wherein the halogen based plasma is selected from the group consisting of $CF_4$, $CHF_3$, $SF_6$, $NF_3$, $Cl_2$, $BCl_3$, HBr, $Br_2$, $I_2$ and mixtures of the same; and the carbon containing gas is selected from the group consisting of $CH_4$, $C_2H_2$, $C_2H_4$, $C_2H_6$, $C_3H_6$, $C_3H_8$, $C_4H_8$, $C_4H_{10}$, $C_5H_{12}$, $C_5H_{10}$, $C_6H_{14}$, $C_6H_{12}$, $C_6H_{10}$, $C_6H_6$, $CH_3OH$, $C_2H_5OH$, $C_3H_7OH$, $CH_3Cl$, $CH_2Cl_2$, and mixtures of the same.

15. The gate stack of claim 14, wherein the amount of carbon containing gas in the etching composition ranges from about 0.1% to about 50% by volume of the etching composition, based on the total volume of the etching composition.

16. The gate stack of claim 15, wherein the amount of carbon containing gas in the etching composition ranges from about 5% to about 15% by volume of the etching composition, based on the total volume of the etching composition.

* * * * *